United States Patent [19]
Thornton et al.

[11] 4,207,522
[45] Jun. 10, 1980

[54] PROGRAMMABLE FREQUENCY SCANNING RADIO SYSTEM

[76] Inventors: Douglas Thornton, 1117 S. Second Ave., Maywood, Ill. 60153; Arthur E. Housholder, 700 Wellington, Elk Grove Village, Ill. 60007

[21] Appl. No.: 790,402

[22] Filed: Apr. 25, 1977

[51] Int. Cl.² ............................................. H04B 1/32
[52] U.S. Cl. ...................................... 455/77; 455/165
[58] Field of Search ................... 325/469, 470, 17, 25, 325/455, 335; 235/92 EV; 328/44, 48; 307/222 R

[56] References Cited

U.S. PATENT DOCUMENTS

| | | | |
|---|---|---|---|
| 3,651,469 | 3/1972 | Keese | 325/470 |
| 3,758,853 | 9/1973 | Dionne et al. | 325/455 |
| 3,803,494 | 4/1974 | Howell et al. | 325/469 |
| 3,864,637 | 2/1975 | Kanow | 325/470 |
| 3,944,925 | 3/1976 | De Laune | 325/17 |
| 3,950,702 | 4/1976 | Saikaishi et al. | 325/470 |
| 3,961,261 | 6/1976 | Pflasterer | 325/470 |
| 3,968,440 | 7/1976 | Ehni | 325/417 |
| 3,983,484 | 9/1976 | Hodama | 325/25 |
| 4,008,436 | 2/1977 | Fujita | 325/470 |
| 4,011,515 | 3/1977 | Hanson | 325/470 |
| 4,013,957 | 3/1977 | Tojo | 325/25 |
| 4,048,570 | 9/1977 | Sumi | 325/470 |
| 4,092,594 | 5/1978 | Baker | 325/25 |

OTHER PUBLICATIONS

Heath's Digital F-M Tuner—David M. Thomas, May 1973—Radio Electronics, pp. 42–50, 98.

Primary Examiner—Marc E. Bookbinder
Attorney, Agent, or Firm—Alter & Weiss

[57] ABSTRACT

A frequency scanning radio system and programming means for selecting the frequencies to be used, and to determne whether or not the channels are in use. The programming means controls not only the direction but also the speed of the frequency scanning in addition to the frequencies monitored. The system further displays the frequency which is being monitored, whether selected by the programming means or selected manually. A further feature is an automatic shifting of frequency when the radio is transmitting into a repeater station.

11 Claims, 6 Drawing Figures

PROGRAMMABLE FREQUENCY SCANNING RADIO SYSTEM

This invention relates generally to radios which use digitally controlled frequency synthesizers to determine their operating frequency, and more particularly it relates to the programming means used in such radios.

There presently are available various types of radios for use in monitoring the two-way communications of others and/or for transceiving on a plurality of preselected stations, channels, or frequencies. There are also presently available manual devices for programming receivers and/or transmitters to select certain channels. However, even the newer circuitry using more sophisticated parts suffer from major shortcomings. For example, each frequency must be manually entered on a set of switches, and each time a new frequency is selected, a new combination of switch settings must be made by the user.

Another shortcoming of the presently available prior art devices is that the scanning occurs at a constant rate or at best at a few different discrete rates.

In addition, many prior art devices provide a pilot type light indication of the frequency which is being received instead of a display of the actual frequency. Further, the prior art automatic scanning systems fail to provide automatic shifting of the frequency when transmitting into repeater stations.

Accordingly, it is an object of this invention to provide a device for conveniently programming any usable channel or frequency into a receiver or transmitter.

It is also an object of this invention to provide an improved scanning means for radios not normally equipped to scan.

It is another object of the present invention to provide a means of scanning upward or downward in frequency.

Another object of the present invention is to provide automatic scanning wherein the rate of scan can be varied infinitely over a range of speeds.

Yet another object of the present invention is to provide means to vary the rate and direction of scanning, and also stop on a particular channel or frequency, using only a single control knob or similar device.

Yet another object of the present invention is to provide a programmable automatic scanning receiver wherein the monitored frequency is constantly displayed.

Still another object of this invention is to provide controls for the scanner to manually stop it on a frequency where there is no signal.

Yet another object of the present invention is to provide means for automatically shifting the frequency when transmitting into a repeater station.

In accordance with a preferred embodiment of the present invention, a radio employing a divisor type frequency synthesis system is provided with programming means for controlling the operation. The programming means includes a potentiometer in a bridge circuit. The potentiometer controls the scanning rate and whether the scanning will occur in the increasing frequency (up) direction or the decreasing frequency (down) direction. The wiper of the potentiometer is normally set so that no unbalanced current flows in the bridge until the potentiometer wiper is moved. Moving the wiper provides an up-down signal to a resettable counter and also provides the input signal to a unijunction type clock.

When the radio controls are in the automatic scan position the squelch circuit signal is used with the clock signal to gate the clock signal to the counter. The clock signal then causes the scan system to move to the next desired channel, if there is no conversation on the channel being scanned, after a certain predetermined scan time.

The output of the counter is coupled to a unique programmable read only memory that controls the display circuitry even when automatic scanning is not used.

The output of the counter also is coupled into a divisor circuit in the divisor type frequency synthesis system to set the frequency utilized by the radio at that instant. The output of the counter also is used for shifting the frequency in the transmit condition. Means are provided for automatically shifting the output of the counter from the highest frequency being scanned to the lowest frequency if the scanning is going up and for automatically shifting the counter from the lowest frequency to the highest frequency if the scanning operation is going down, so as to prevent the radio from operating on a frequency outside the desired range of frequencies of interest.

The above-mentioned and other objects and features of this invention may be best understood from the following specification when taken in conjunction with the attached drawings, wherein.

Figure 1:
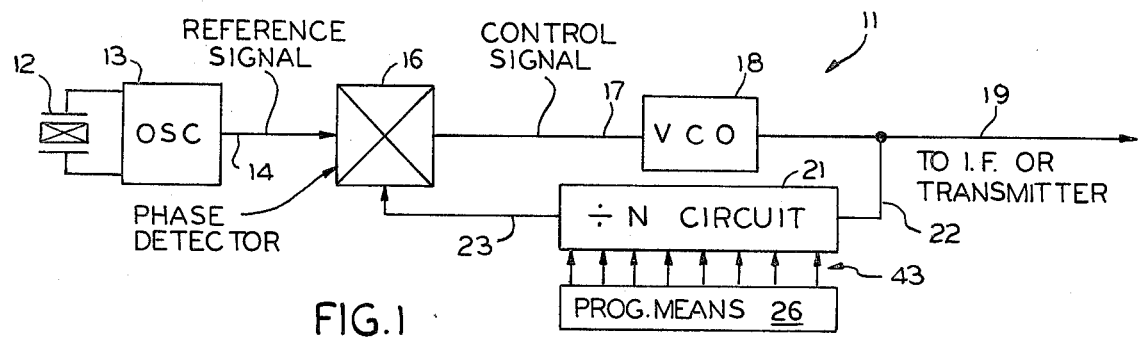
FIG. 1 is a partial block diagram showing pertinent parts of a radio of the type using the unique programming means for controlling the scanning operation.

FIG. 1 shows a radio synthesizer of the type amenable to using the programmable system of this invention. More particularly, FIG. 1 shows pertinent portions of a "divisor" frequency synthesis type radio 11. The portion of the radio shown includes means such as crystal 12 for providing a standard or base frequency signal. The crystal operates in conjuction with oscillator 13 to produce a reference signal on conductor 14. The reference signal is supplied to a phase detector 16. The output of the phase detector is a control signal on conductor 17 which is coupled to the voltage controlled oscillator 18. The output of the voltage control oscillator on conductor 19 determines the frequency at which the radio operates. Conductor 19 is connected either to an intermediate frequency oscillator stage of a receiver or to the transmitter when the radio is in its transmitting mode.

A "divisor" or divide by N counter circuit 21 uses as its input the signal on conductor 19 brought over the conductor 22. The output of the divide by N counter circuit 21 is fed back into the phase detector 16 over conductor 23. The divide by N counter circuit has several stages and is capable of being programmed to divide by different divisors. Thus, with a single frequency determining means, a great many frequencies can be obtained at the output of the VCO 18.

The frequency at the output of the VCO 18 is 1/N of the reference signal and is continually compared to the reference frequency signal. Any difference between 1/N of the reference frequency signal and the frequency obtained at the output of the VCO is fed back into the VCO as a correction signal thereby providing a closed loop feedback system known as a "phase-locked-loop" accurately producing many possible frequencies with only one reference source. A programming means 26 automatically determines which radio channel or frequency the radio should scan. The programming means may include, among other things, switches, diode matrices, or other means for selecting which of the frequencies will be scanned.

Figure 2:
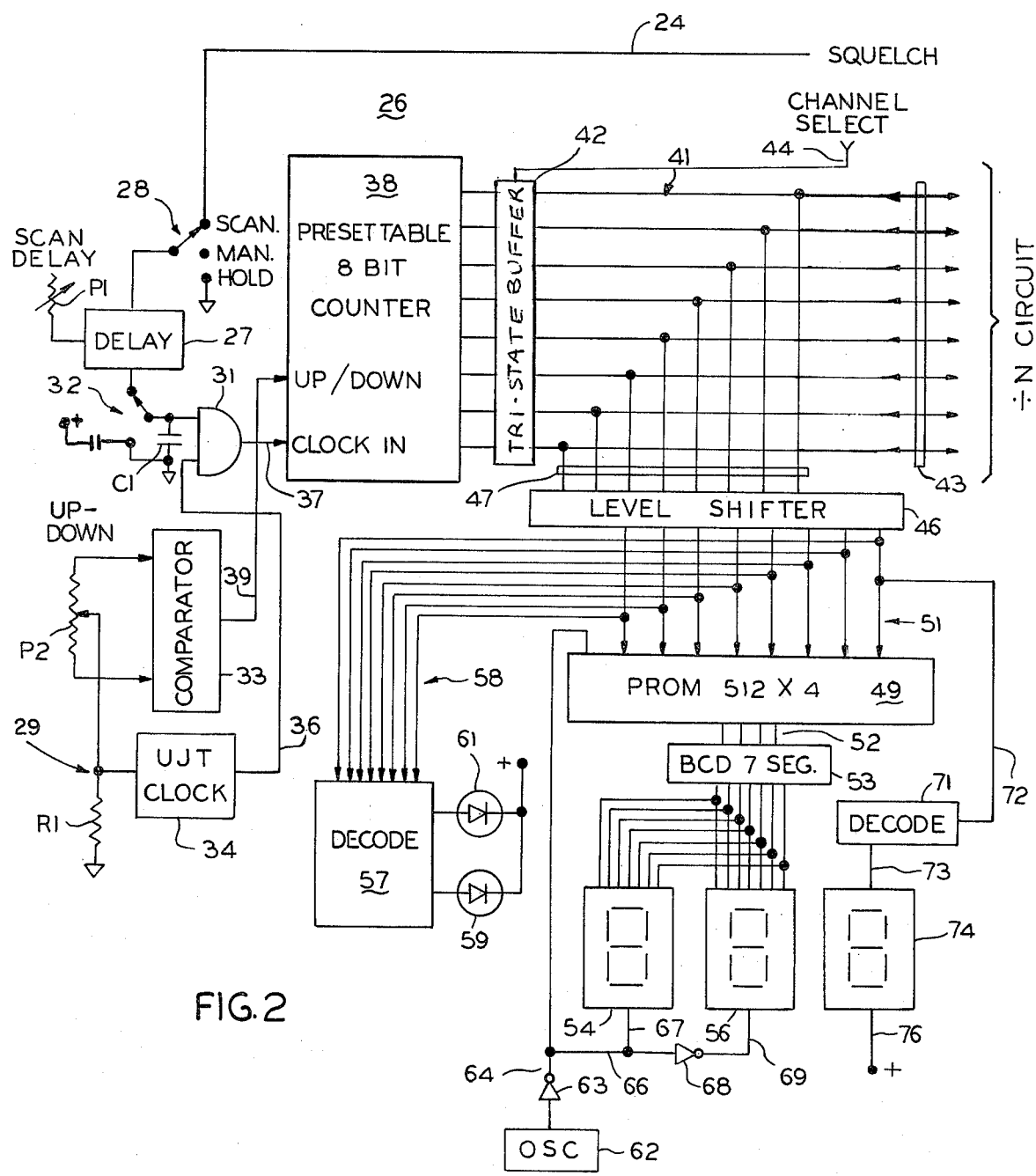
FIG. 2 is a more detailed block diagram of the programming means shown in FIG. 1.

FIG. 2 is a block diagram of the programming means 26 Means are provided for determining when a scanned channel is in use. More particularly, the squelch signal from the radio is brought into the programming means over conductor 24, shown at the top of FIG. 2. When the radio is in the automatic scan position, then the squelch signal is brought to a delay circuit 27 through switch 28. The delay prevents scanning from resuming for a brief period of time after conversation stops, so that interruptions of short duration will not cause scanning to resume.

The wiper of switch 28 can be set at either the scan position, a manual position, or a hold position. In the manual position each of the possible channels or frequencies which the radio can receive can be manually scanned by using manual frequency controls indicated at 30. In the hold position, the radio is kept on a single frequency.

Means are provided for retaining the radio at the particular frequency being scanned for an adjustable time period. More particularly, the delay period of the delay circuit 27 is adjustable by means of a potentiometer P1. The output of the delay circuit 27 is coupled to AND gate 31 through switch 32, which may be used in a momentary operation to pass a channel on which scanning has stopped. Switch 32 connects one input of the AND gate 31 either to the delay circuit 27 or to a voltage source. A timing capacitor C1 is connected between ground and the delay input to the AND gate 31.

The other input to the AND gate comes from a clock circuit 29 over conductor 36. An up-down scan control potentiometer P2 is coupled to the input of the clock circuit through its wiper. The wiper is also connected to ground through resistor R1 which extends from the clock circuit to ground.

The delayed squelch signal enables the AND gate 31 to transmit the clock signal over the conductor 37 into the clock input of a presettable 8-bit counter 38. Each pulse signal from the clock causes the counter to step to the next number.

Means are provided for indicating to the counter whether the the automatic scan is to proceed upwardly or downwardly; that is, whether the scan is to proceed toward the higher frequencies first or toward the lower frequencies first. That means includes the up-down potentiometer P2 and a comparator 33. The signal from the comparator is carried over conductor 39 to the up-down input of counter 38.

The output of the counter is carried over the leads indicated collectively as 41 through a buffer circuit 42 to the divide by N circuit 21. A channel select signal from the radio is fed to the buffer circuit 42 over conductor 44.

The signals from the counter 38 also are used for providing the display of the frequency or channel that is being monitored. The signals from the counter 38 are transferred to a level shifter 46 via the leads indicated collectively as 47. The lowered voltage output of the level shifter 46 is connected to a programmable read-only memory 49 over leads indicated collectively as 51. The output of the read-only memory circuit 49 is coupled over leads indicated collectively as 52 to a binary coded decimal to seven segment converter 53 and from there to the read out devices shown as 54 and 56.

In the actual embodiment shown and described herein, frequencies in the 146 and 147 MHz range are scanned. Means are provided for determining whether the scanning is occurring in the 146 or 147 MHz range. This means includes a decoder 57 coupled by leads shown collectively as 58 to level shifter 46. The output of the decoder 57 either lights the light emitting diode 59 or light emitting diode 61. The light emitting diode 59 indicates that the scanning is occurring in the 146 MHz range and the diode 61 indicates that the scanning is occurring at the 147 MHz range.

A separate oscillator 62 is used to multiplex the read-out devices 54 and 56. The oscillator 62 is coupled through a gate 63 and conductor 64 to the read-only memory. The oscillator 62 is also coupled through conductors 66 and 67 into the read-out device 54 to cause that read-out device to operate, or through gate 68 and conductor 69 into read-out device 56 to enable that device.

The last digit of the frequency being scanned will, in this case, either be a zero or a five. This is determined by a decoder 71 which is connected to the last conductor of conductors 51 by conductor 72 and from there through conductors shown collectively as 73 to read-out device 74. The read-out device 74 is coupled to positive voltage over lead 76.

Thus, the display equipment is coupled to the output of the presettable counter. Decoder 57 determines whether the scan is occurring in the 146 or 147 MHz range. The next digit of the frequency being scanned is read either on read-out device 54 or 56. Read-out device 74 then indicates the last digit which is either a zero or a five.

Figure 3:
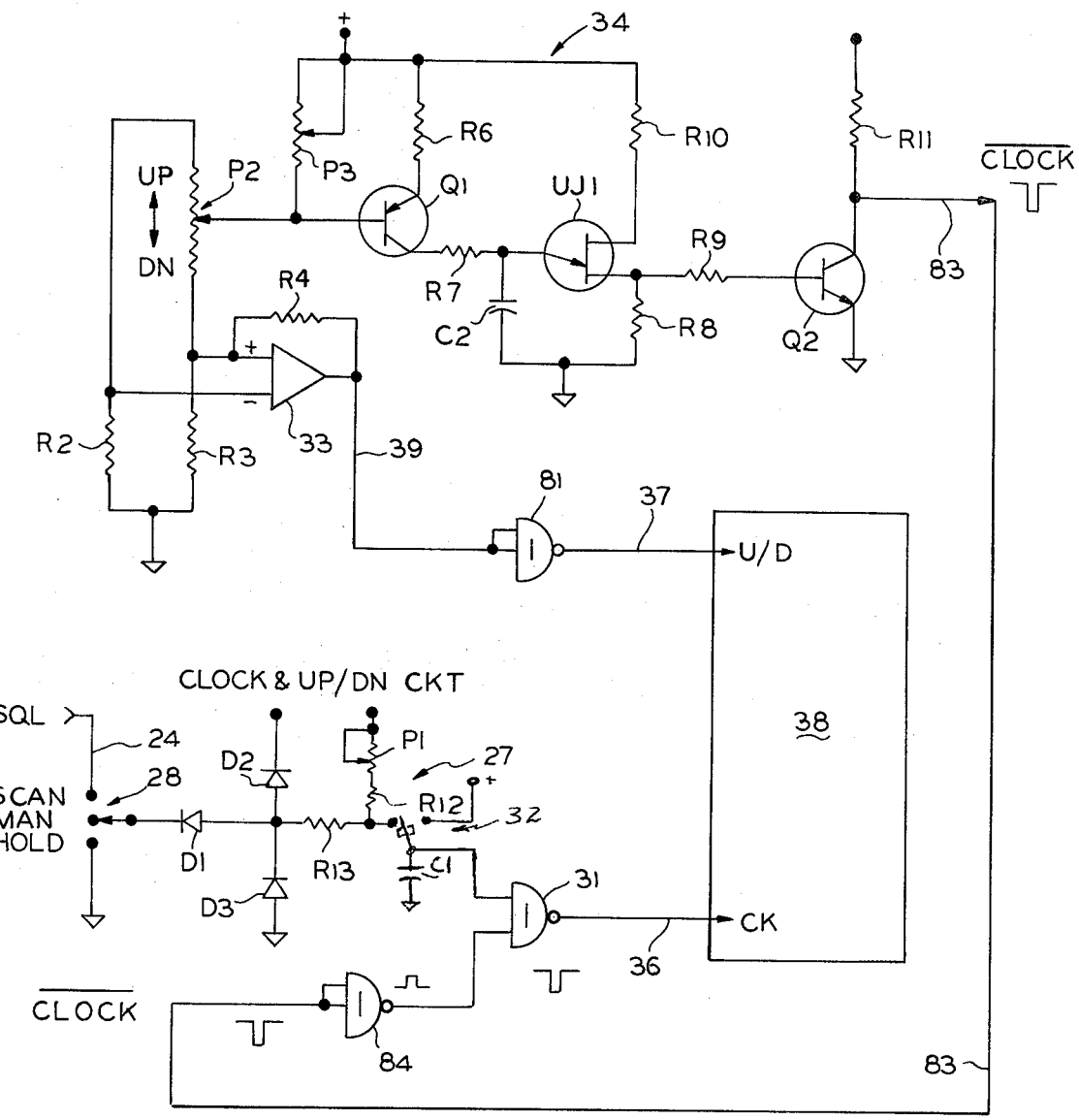
FIG. 3 is a schematic diagram of the circuitry of the blocks providing information to the counter of FIG. 2.

Individual circuits are schematically shown on the succeeding drawings. More particularly, for example, FIG. 3 shows schematics of the circuits leading into the counter 38 such as delay circuit 27, clock circuit 34, AND gate 31, comparator circuit 33 and associated potentiometers and switches. Potentiometer P2 which is coupled to both the clock and the comparator is part of a bridge circuit that includes resistors R2 and R3 tied to ground. The voltage input to the potentiometer P2 is obtained from the clock circuit 34. More particularly, positive voltage comes through windings of potentiometer P3 and the wiper of potentiometer P3 to the wiper of potentiometer P2.

Both sides of the windings of potentiometer P2 are connected respectively to the positive and negative inputs of comparator amplifier 33. A positive feedback resistor R4 connects the output of the amplifier 33 to its positive input. The output of the comparator amplifier is coupled through conductor 39 to Schmitt trigger 81.

The output of Schmitt trigger 81 is connected by conductor 37 to the up-down input of the counter 38. When the wiper of potentiometer P2 is turned upward, then the output of the comparator amplifier is a low since the signal to the inverting or negative input of the comparator 33 is greater than the signal of the positive or non-inverting input of the comparator. When the wiper of potentiometer P2 is turned downward then a more positive voltage is placed on the positive input of the amplifier than on the negative input of the amplifier and, accordingly, the output of the amplifier is high. Consequently, the output of the Schmitt trigger 81 is high when the wiper of the potentiometer is turned in the up direction and low when the wiper is turned in the down direction. In this manner, means are provided for determining whether the potentiometer is turned upward or downward.

Means are provided for varying the rate of scan. This is accomplished through the clock circuit and associated controls. The counter provides the next number output responsive to a clock signal. If the clock signals are coming faster, then the counter counts faster and, consequently, the scanning occurs at a faster rate. When potentiometer P2 is balanced, i.e., with the wiper centered, then a minimum current flows through the winding of potentiometer P3. Since the winding of potentiometer P3 is in the base circuit of transistor Q1, the transistor is in its non-conducting state when the minimum current flows. However, as the wiper potentiometer P2 is moved off center the base current on transistor Q1 increases. As the potentiometer P2 is moved further away from the center point, more current flows in the circuit that extends from positive voltage through the potentiometer P3, potentiometer P2 and resistors R2 and R3 to ground. The resulting larger voltage drop in the winding of potentiometer P3 increases the base current in transistor Q1. The flow of base current, of course, causes flow of current in the collector circuit. Thus, current flows from positive voltage through resistor R6, the emitter of transistor Q1, the collector of transistor Q1 and resistor R7 to charge capacitor C2. Capacitor C2 is coupled to the emitter of unijunction transistor UJ1. The base of the unijunction transistor is coupled to positive voltage through resistor R10.

When the voltage on the capacitor C2 charges sufficiently so that it equals the negative resistance point of the unijunction transistor UJ1, the capacitor is discharged through the unijunction transistor and resistor R8 to ground to create a clock pulse. This pulse is transmitted through resistor R9 to the base of pulse shaping transistor Q2. Transistor Q2 is an NpN transistor and provides an amplified, shaped pulse over the circuit which extends from positive voltage through load resistor R11, and transistor Q2 to ground. The clock pulse is carried over conductor 83 through an inverter gate 84 to one input of gate 31 shown here as a NAND gate. The other input to gate 31 is obtained from the scan delay circuit 27. The scan delay circuit 27 is supplied positive voltage through potentiometer P1 and resistor R12 to charge capacitor C1.

Means are provided for transmitting the clock signal to the counter if there is no signal on the frequency being scanned, to step the system to the next channel to be scanned. More particularly, the capacitor C1 is prevented from charging when there is a signal on the channel being scanned by the squelch circuit which then provides a low signal on conductor 24. With switch 28 in the scan position the low on conductor 24 keeps the capacitor C1 discharged through resistor R13 and diode D1. Thus, if there is a conversation on the the channel being scanned, then the capacitor C1 does not charge up and a low is placed on one of the inputs of the NAND gate 31. A high is thus obtained at the output of the NAND gate 31 so that no clock pulse is provided to the clock terminal of the counter and the counter does not step. However, if there is no conversation on the frequency being scanned, then there is a high on conductor 24 and capacitor C1 charges up after a delay to place a high at the input of the NAND gate. When a clock pulse occurs, there are two highs at the input of the NAND gate, a pulse is received at the output of the NAND gate 31 and the counter is stepped. A momentary manual bypass feature is provided by switch 32, which, when closed, instantly charges capacitor C1 by connecting it to the positive voltage supply. This causes the same effect as if no conversation were present on the frequency, allowing the counter to bypass manually an undesired channel. Note that if switch 28 is turned to the hold position then the capacitor is also kept from charging since it discharges through resistor R13 and diode D1 to ground. In the manual position, the capacitor charges even when a conversation is present, thus allowing manual control of scanning. Transient voltage protection is provided by a circuit including diode D2 connected between positive voltage and the junction of resistor 13 and diode D1 and D3.

Figure 4:
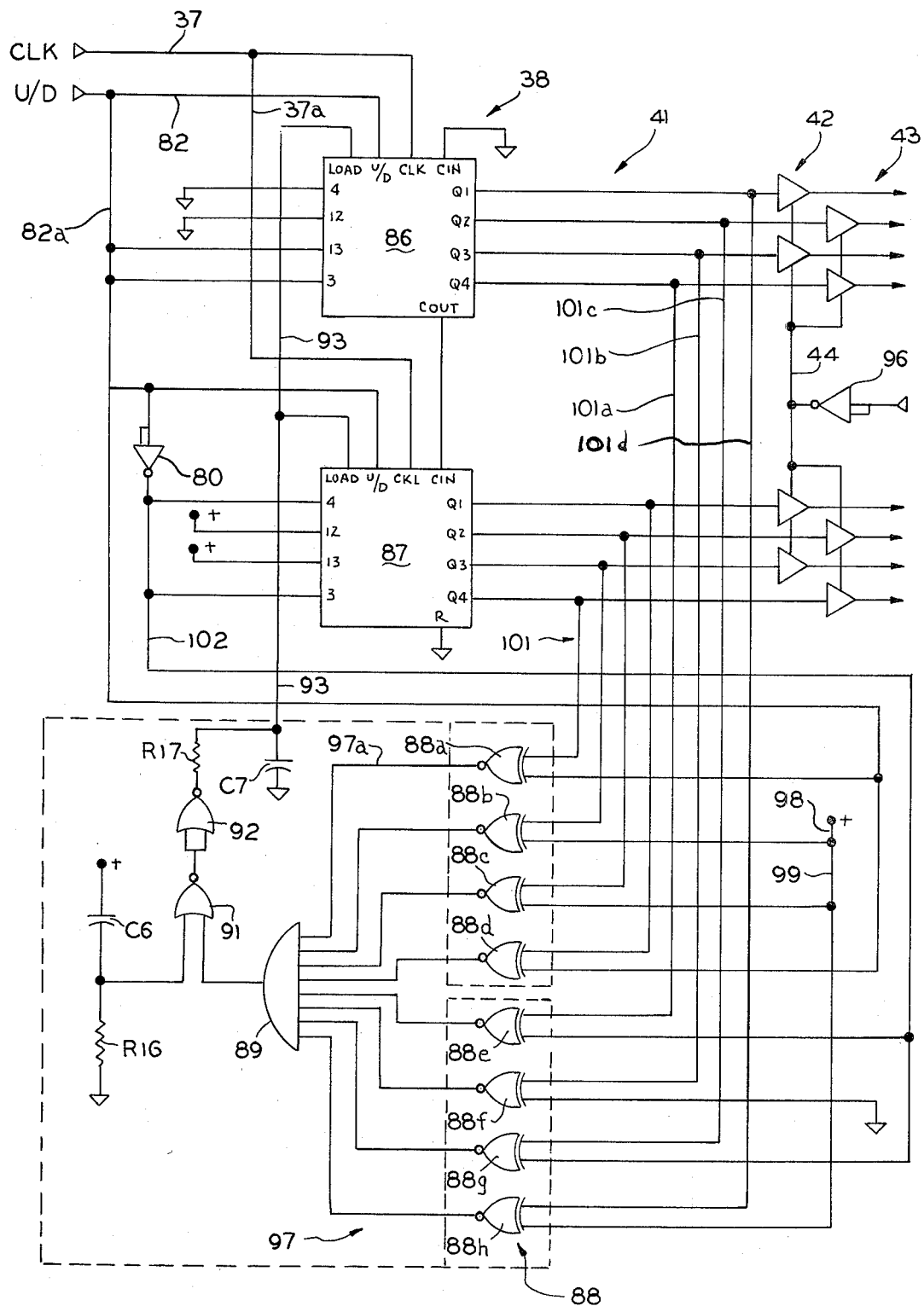
FIG. 4 is a schematic showing of the counter section including the buffer shown in FIG. 2.

FIG. 4 schematically shows details of the circuitry of counter 38. In FIG. 4, it should be noted that the clock pulse, on conductors 37, 37a is actually fed into the clock input of a pair of counters. In a preferred embodiment, these were binary up and down counters 86,87 as manufactured by Motorola No. MC14516B.

The up-down signal on conductor 82, 82a is connected to the up-down input control pins of counters 86 and 87 respectively. The up-down signal is also connected to pins 3 and 13 of counter 86 and through inverter 88 to pin 4 of counter 87. Thus, in counter 87 an inverted up-down signal is connected to pin 4. Pins 4 and 12 of counter 86 are grounded. Positive voltage is connected to pins 12 and 13 of counter 87. Each of the counters has four individual outputs Q1, Q2, Q3, and Q4.

Means such as repeat count circuitry are provided for determining when the counter circuits have reached either of two predetermined numbers representing the upper limit and lower limit of acceptable divisors for the synthesizer in the radio, respectively. This means includes exclusive OR gate circuitry wherein a plurality of exclusive OR gates 88 are provided and the output of each of the exclusive OR gates is coupled to the inputs of an AND gate 89. The output of the AND gate 89 is connected to one input of NOR gate 91. The other input of the NOR gate 91 is obtained from a positive voltage at the junction of capacitor C6 and resistor R16 to ground. This circuitry keeps the counters continuously within a prescribed range. For example, within the range of 146 through 148 MHz.

The repeat count circuitry including the exclusive OR circuit 88 operates in the following manner. If the counters 86, 87 are operating in the up mode, then there will be a logic one signal on the exclusive OR gates 88a and 88d. Simultaneously, note that gates 88e and 88g get the inverse of the up-down signal, that is, when there is a down signal gates 88e and 88g receive a logic one or a high. Therefore, when going in the up direction, there is always a signal on gate 88a and 88d through bus 82a.

At the top of the frequency being scanned, there is a logic high at the Q2, Q3, and Q4 outputs of counter 86 which is extended over conductors 101a, 101b, and 101c to the inputs of exclusive OR gates 88g, 88f, and 88e, respectively. Thus, each of the exclusive OR gates 88 at the top of the frequency band has a signal on one of its inputs so that each of the inputs to the AND gate 89 is activated. A logic one output is thereby provided by the AND gate. The logic high output from the AND gate is fed to the series pair of NOR gates resulting in a high signal on conductor 93 connected to the load terminals of counters 86 and 87. Responsive to that signal the counters continue to count upward but start at the lowest frequency to be scanned. In a similar manner, a logical high is obtained from the AND gate 89 during the down count, when the lowest frequency is reached to load the counters and start them counting down from their highest frequency load bus. The up-down signal is inverted by inverter gate 80. The output of the inverter gate 80 is attached to pins 4 and 3 of the counter 87 and is also connected through conductor 102 to inputs on exclusive OR gates 88e and 88g. Note that the load bus 93 is coupled to ground through filter capacitor C7.

A plurality of buffer gates 42 are provided between the outputs of the counter and the conductor 43 carrying the buffered outputs to the synthesizer or divide by N circuit in the radio. Means are provided for controlling the buffer amplifiers 42 responsive to a manually operated channel select switch internal to the radio. This allows the radio to be controlled from an internal frequency programming means, such as switches or diode matrices, by disabling the buffer amplifer 42. More particularly, gate 96 is shown connected to the buffer amplifiers 42 to control the operation of the buffer amplifiers responsive to the manual operation of the channel select switch in the radio.

Figure 5:
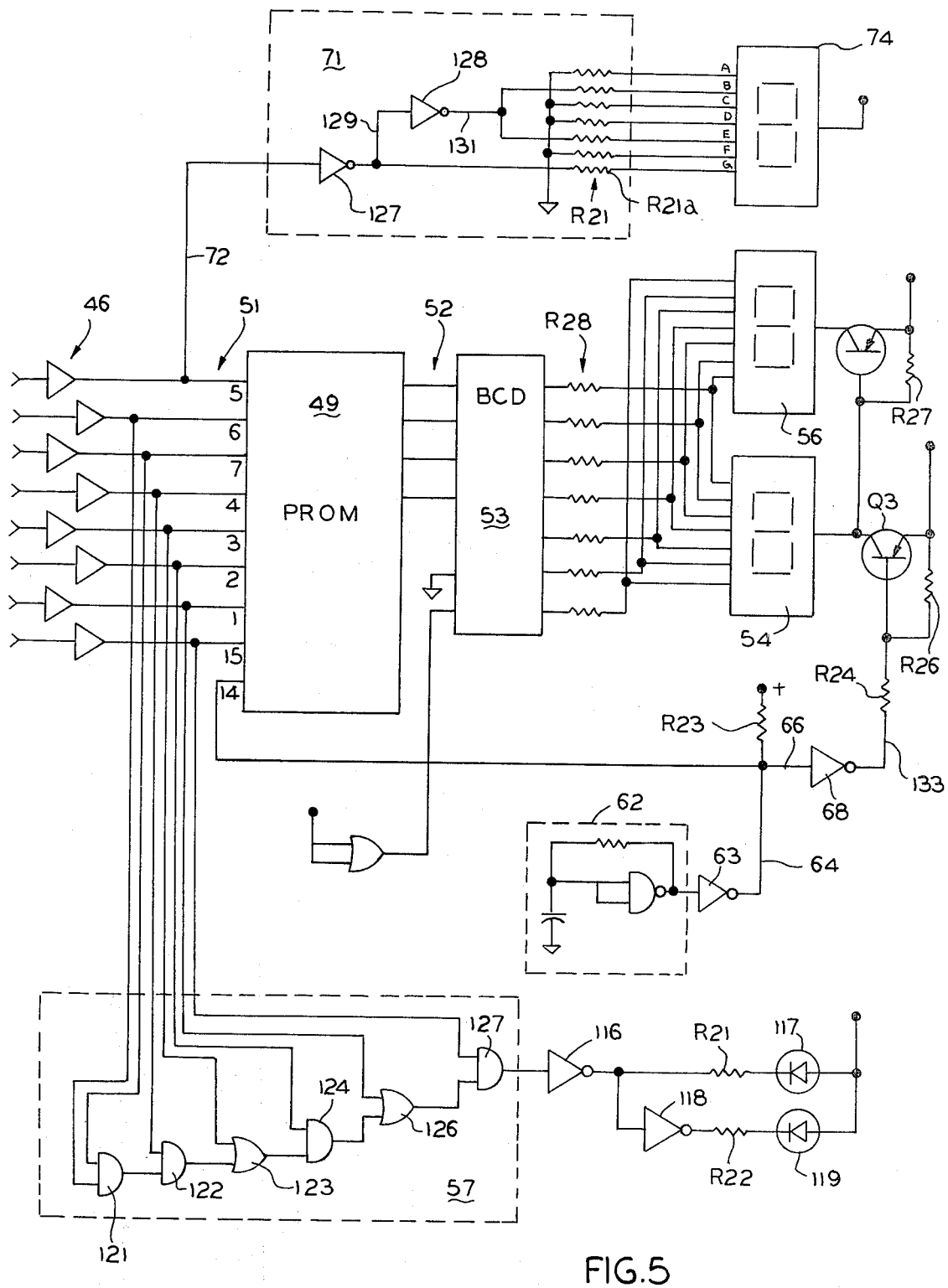
FIG. 5 is a schematic showing of the display circuitry shown in FIG. 2, including the programmable read-only memory and the coding and decoding equipment.

Even when the system is not active; i.e., when the radio's internal frequency programming means is in use, the programming circuitry provides display means for reading out the frequency at which the radio is operating. The display circuitry is shown schematically in FIG. 5. It includes the read-out memory 49, the BCD 53, the oscillator 62, decoder 57 and decoder 71. The signals coming from the output of the counter pass through a level shifting network 46 comprised of a plurality of amplifiers which change the voltage level of the signal coming from the counter.

Eight input conductors 51 connect the output of the level shifting amplifiers 46 to the read-only memory 49. Four output conductors 52 connect the ROM 49 to the binary coded decimal to seven segment converter 53. The converter converts the out put of the read-only memory to energize particular segments of the read-out devices 54 and 56. The read-only memory 49 is is programmed to convert the binary divisor to decimal numbers. The decimal numbers are decoded by the seven segment decoder 53.

Means are provided for determining whether the frequency being scanned is in the 146 MHz or the 147 MHz range. More particularly, decoder circuit 57 is attached to the input leads of the read-only memory. The output of the decoder circuit 57 is a logic high if the program frequency falls between 147 and 148 MHz and is a logic low if the program frequency falls between 146 and 147 MHz. The output of circuit 57 is connected to an inverter gate 116. The output of the inverter gate is coupled directly to the cathode of LED 117 through resistor R21. The anode of LED 117 is tied to positive voltage. Thus the high signal going through the inverter becomes a low and enables the energization of LED 117 to thereby indicate that the scanned frequencies are in the 147 MHz range.

When the output of the circuit 57 is a logic low, it is converted to a logic high by inverter gate 116. With the logic high attached to the cathode of LED 117, it fails to light. The logic one is also attached to the input of inverter gate 118. The output of gate 118 is attached through resistor R22 to the cathode of LED 119 enabling LED 119 responsive to a low at the output of circuit 57. Thus, circuit 57 provides a high at its output when there is a logic high on inputs 6 and 7 of read-only memory 49 and a high on input 4 or a high an input 3 and a high on input 1 and a high on input 15 of circuit 57. When there is a high on inputs 6 and 7, then the output of AND gate 121 is high. If there is also a high on input 4, then the output of AND gate 122 is high. The high on the output of gate 122 causes the output of gate 123 to also go high. A high on input 3 also causes the output of OR gate 123 to go high. If when the output of gate 123 is high, there is also a high on input 2 and then gate 124 goes high. The high on gate 124 causes the output of OR gate 126 to go high. A high on input also causes the output of OR gate 126 to go high. If while the output of gate 126 is high, there is also a high on input 15 then the output of gate 127 goes high to indicate that the frequencies being scanned is in the range between 147 and 148 MHz. A high is also required on the input 15 to obtain an indication that the frequency being scanned is between 147 and 148 MHz. Thus, based on the output of the circuit 57 and, consequently, LEDS 117 and 119, a display is made showing whether the frequency being scanned is between 147 and 148 MHz.

The decode circuit 71 determines whether there is a high or a low on input 5 of the read-only memory 49. The signal from input 5 going into the memory 49 is carried over conductor 72 to inverter gate 127 and from there through one of the group of resistors R111 into one of the seven inputs of the display unit 74. If there is a high carried into inverter 127, a low appears at its output. The output of inverter 127 is connected to inverter 128 through conductor 129. The output of inverter 128 is opposite, of course, of the output of inverter 127 and, therefore, in the example places a high on conductor 131. Conductor 131 is connected to inputs b and e of display unit 74. The rest of the inputs of display units 74, that is, inputs a, c, d, and f are grounded through individual resistors of resistor network R11. If the output of inverter 128 is high, the b and e inputs are energized to provide a five reading out of the display unit 74. A high on the output of inverter 127 energizes the g input over conductor 130 to provide a zero reading on display 74.

Means are provided for obtaining a multi-digit display of the scanned frequency using only a single read-out memory. These means include multiplexing apparatus using oscillator 62. The output of oscillator 62 provides the input to gate 63. The output of gate 63 is carried through conductor 64 to input 14 of the PROM 49 and also through conductor 66 to inverter gate 68. It should be noted that positive potential is carried through resistor R23 to the junction of conductors 64 and 66. Thus normally there is a high on conductor 64 and a high at the input of inverter 68 resulting in a low on conductor 133 at the output of the inverter 68. Conductor 133 is coupled through resistor R24 to the base of PNP transistor Q3. The emitter of the transistor Q3 is connected directly to positive voltage and to the base through resistor R26.

When there is a low at the output of gate 63, there is a high on conductor 133, then transistor Q3 is blocked. When there is a low at the output of gate 68, then the transistor Q3 operates to supply positive voltage to display device 54 enabling that display circuit. At the same time the positive signal at the emitter of Q3 which enables display circuit 54 also insures that PNP transistor Q4 is blocked. When transistor Q4 is in a non-conducting state, then display unit 56 is not enabled and does not display. When transistor Q3 is in its non-conducting state, then transistor Q4 conducts to enable circuit 56. Thus, multiplexing circuitry enables either display device 56 or display device 54 responsive to signals received from circuit 53 through the resistors generally referred to as R28.

Figure 6:
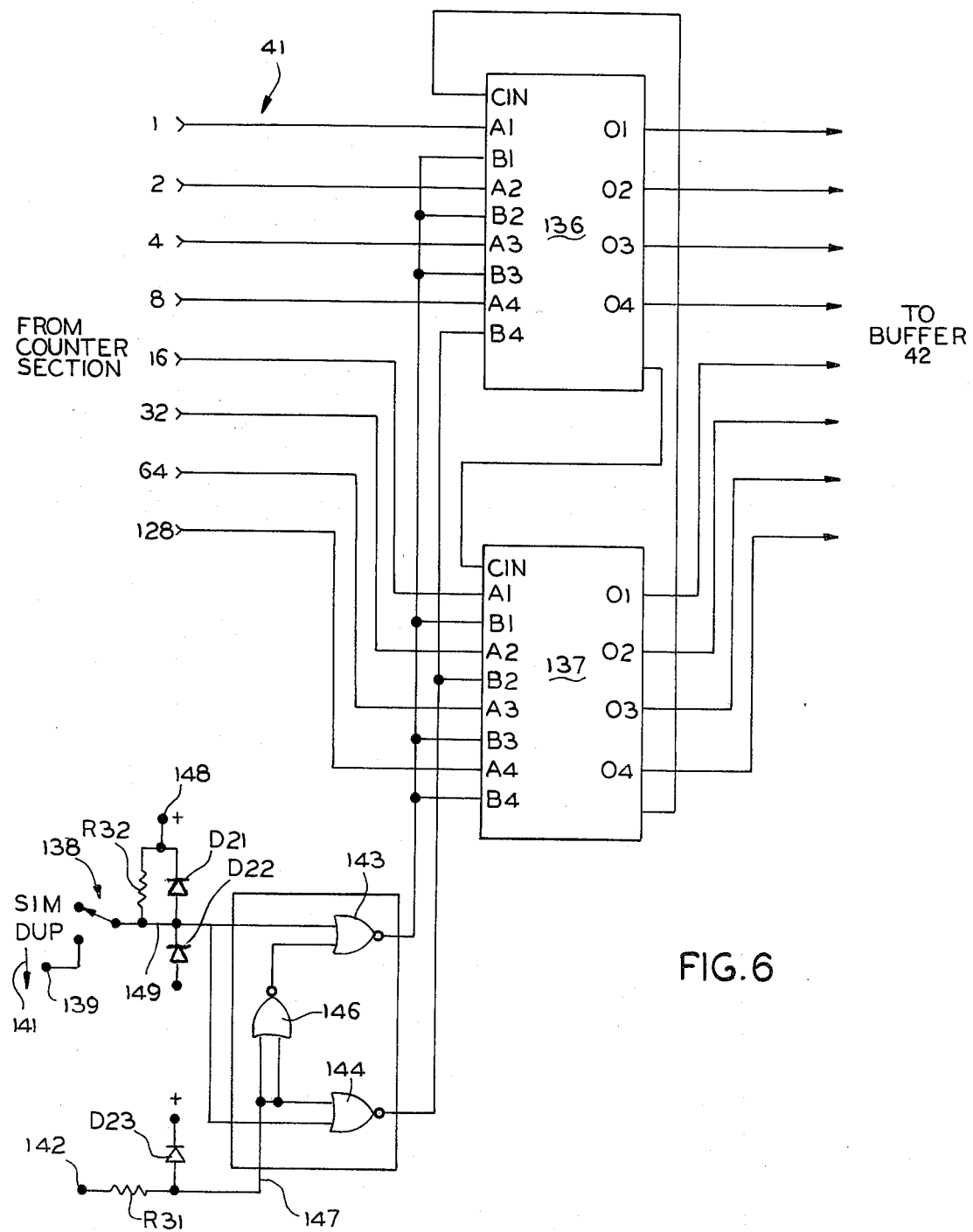
FIG. 6 is a schematic showing of the the frequency offset or shifting circuitry used when transmitting into a repeater station.

Means are provided for shifting the frequency in the transmit mode. More particularly, referring to FIG. 6, the output leads of the counter shown as leads 41, collectively, also are coupled to an adder means such as adders 136 and 137. The adders are not shown in FIG. 2, for purposes of clarity, however, it must be realized that these adders are actually in circuitry of FIG. 2 for the frequency shifting purposes. When the radio is in the receive mode, nothing happens in the adders; however, when switch 138 is operated to the duplex position for transmitting and when terminal 139 is grounded by the push-to-talk button indicated by arrow 141, then a predetermined number is added to or subtracted from the input frequency depending upon the indication of the operating frequency line 142. When the push-to-talk switch is operated to ground terminal 139, while the switch 138 is in the duplex position, the ground is fed into the non-inverting input of gate 143 and into the non-inverting input of gate 144. At the same time the signal on 142 is connected to both inputs of gate 146 through resistor R31 and conductor 147.

When the radio is operating in the transmit or duplex mode, then the adder circuits 136 and 137 add a predetermined number from the inputs from the counter; that is, the predetermined number is added to the counter number, or subtracted from the counter number. The output of the adder is connected through the buffer 42 to the program means 26 of FIG. 1. Thus, added to the binary inputs obtained from the counter, that is, on conductors 41 which are indicated by the numbers 1, 2, 4, 8, 16, 32, 64, 128 are predetermined numbers provided by the NOR gates 143, 144, and 146. The output signals are added to the adder inputs B1, B2, B3, and B4 of the adders. The output of gate 143 is fed into inputs B1, B2, and B3 of adder 136 and into inputs B1, B3 and B4 of adder 137. The output of gate 144 is fed into the B4 input of adder 136 and into the B2 input of adder 137.

Over voltage protection is provided by the clamping circuits comprising a source of positive voltage 148, diodes D21 and D22. Diode D22 couples conductor 149 to ground. Conductor 147 is connected to positive voltage through diode D23. Thus a logic high signal at terminal 142 indicates operation of a frequency of 146 MHz; i.e., below 147 MHz. When terminal 142 is high, a high signal is applied to one input of gate 144 and to both inputs of gate 146. In the duplex mode with the push-to-talk switch operated there is a low at the other input of gate 144. Since gate 144 is a NOR gate, the high input causes a low output. The high on conductor 147 from terminal 142 is converted to a low by inverter 146 and thus two lows are fed to NOR gate 143 resulting in a high at the output of gate 143. The high at the output at gate 143 and the low at output of gate 144 commands the adders to subtract a number (600 KHz) so the outputs of the gates 143 and 144 command the addition or subtraction desired. If the signal at terminal 142 is a low indicating that the radio is operating on the 147 MHz band, then there is a low output from gates 143 and a high from gate 144 and addition occurs in the adders.

Thus, the program provided accomplishes the objects of this invention by providing means for automatically scanning the frequency range up or down and controlling the velocity of the scan and the direction of the scan with a single potentiometer. The scan potentiometer also controls the radio frequency in the manual mode. Further, the display of the device is uniquely controlled to show a display of the frequency at which the radio is operating, whether or not it is on the automatic scan position mode. Similarly, means are provided for shifting the frequency in the transmission mode.

While the principles of the invention have been described above in connection with specific apparatus and applications, it is to be understood that this description is made only by way of example and not as a limitation on the scope of the invention.

What is claimed is:

1. A frequency programming means for automatically selecting the operating channel of a scanning radio system,
    said programming means using divide by N circuit means in a frequency synthesis system.
    said programming means further comprising presettable up-down counter means for providing set count numbers to the divide by N circuit means and thereby be determinate of the channels to be scanned and thereby enabling said radio system to skip certain channels,
    clock means for providing pulses to said counter means for counting and to determine the count rate of the counter means responsive to the pulse rate of the pulses provided,
    AND gate means for coupling said clock to said counter to step the counter responsive to the output of said gate means;
    said AND gate means operated as a function of the use of the channels for controlling the clock output, whereby when said channel is in use, then the pulse from the clock is not transmitted to the counter,
    up-down means coupled to said counter means for selecting either the up or down direction of said counter means,
    single control means for operating said up-down means to select the up or down direction,
    said single control means comprising a potentiometer, and
    said potentiometer operating to also vary the pulse rate output of said clock means over a continuous range of pulse rates.

2. The frequency scanning radio system of claim 1 wherein means are provided for determining whether the channel being scanned is in use.
    said AND gate means operated in responsive to said determining means indicating the non-use of said scanned channel to allow said clock pulse to be applied to said counter means to scan said channels, delay means coupled to said AND gate means for delaying the enabling of said AND gate means responsive to said indication of non-use to thereby delay stepping the counter responsive to pulses from said clock means, and multiple input AND gate means operated responsive to said count numbers from the output of said counter means and from said up-down means to enable said counter means after counting in the upward direction to proceed from any selected count to the lowest count of the range of the counter means, and after counting in the downward direction to proceed from any selected count to the highest count of the range of the counter means.

3. An improved frequency programming means for automatically scanning desired bands of frequencies for selecting the operating frequency of a radio system, said programming means using a divide by N frequency synthesis arrangement, counter means for providing count numbers to said divide by N frequency synthesis arrangement determinative of the frequencies to be scanned, clock means for controlling the count rate of the counter means, up-down means for providing up or down signals for controlling the up or down direction of counting by said counter means, said up-down means comprising comparator circuit means having a pair of inputs, potentiometer means for varying the inputs relative to each other responsive to the movement of the wiper of the potentiometer, and means coupling the output of said comparator means to said counter means to control the count direction of said counter means responsive to the movement of the wiper of the potentiometer means.

4. The frequency scanning radio system of claim 3 wherein said means for coupling said comparator means to said up-down counter means include Schmitt trigger means to provide positive directional control.

5. The frequency scanning radio system of claim 3, wherein said potentiometer means controls the clock rate.

6. An improved frequency scanning radio system for automatically scanning desired bands of frequency for selecting the channel of operation of the radio system, said frequency scanning radio system using a divide by N frequency synthesis arrangement including counter means providing count numbers to the divide by N frequency synthesis arrangement which count numbers are determinative of the frequency of the channels scanned, clock means for providing timed output pulses for controlling the count rate of the counter means, up-down means for providing up or down signals for controlling the up or down direction of counting by said counter means, said up-down means including means for controlling the clock rate and thereby selectively increasing or decreasing the scanning rate, detecting means for providing signals responsive to detecting when the highest count is reached, when counting in the up direction, and when the lowest count is reached, when counting in the down direction, to start said counting means counting from its lowest number or highest number, respectively, said detecting means comprising:

exclusive OR gate means;

means operated responsive to the up signals from the up-down means for providing an operating exclusive OR logic 1 signal to inputs of the exclusive OR gate means to cause said OR gate means to provide an output signal;

AND gate means operated responsive to the output signals from the OR gate means to provide either a logic 1 or a logic 0 signal, logic gate means operated responsive to the logic 1 signal output from said AND gate means for providing a signal to said counter means to cause said counter means to commence to count from the lowest number in the upward direction, and said logic gate means operated responsive to a logic 0 signal from said AND gate means to cause the counter means to count from the highest number in the downward direction.

7. An improved frequency scanning transceiver radio system for automatically scanning desired bands of frequencies for selecting a channel of operation for the radio system, said transceiver frequency scanning radio system including means for selectively operating in either a transmitting mode or a receiving mode, said system using a divide by N frequency synthesizer arrangement including divide by N circuit means, pre-settable up-down counter means providing count numbers to said divide by N circuit means determinative of the frequency of the channel scanned, adder means between said counter means and said divide by N circuit means to add or subtract to or from the count provided by the counter means, clock means for providing timed output pulses for controlling the count rate of the counter means, up-down means for selecting up or down signals for controlling the up or down direction of said counter means, said up-down means including single control means simultaneously controlling the clock rate with the selection of the up-down signals, logic means for determining and indicating whether the frequency of the channel being used in the transmit mode is above or below the midpoint of the frequencies provided by the radio system, and means responsive to said logic means indicating that the transmitted frequency is below the midpoint of the frequencies provided by the radio system for subtracting from the number of the counter means to thereby shift the frequency in a higher direction.

8. The system of claim 7 and means responsive to said logic means determining that the transmitted frequency is above the midpoint of the frequencies provided for adding to the number of the counter means to thereby shift the frequency in a lower direction.

9. An improved frequency scanning radio system including programming means for controlled frequency synthesizer circuitry to select the frequencies to be scanned, said frequency synthesizer circuitry employing divide by N circuit means, said programming means comprising frequency scan control means for selectively operating said frequency scanning radio system in an automatic scan mode or a manual scan mode, pre-settable counter means for providing count numbers to the divide by N circuit means determinative of the frequencies to be scanned, manual frequency determinative means to allow automatic frequency scanning in said automatic mode and for selectively disconnecting the output of said counting means from said divide by N circuit to allow manual frequency scanning for connecting the output of said pre-settable counter means provide clock pulses to the divide by N circuit means in the manual mode, clock means provide clock pulses for controlling the rate of the count of said counter means, said improvement characterized in that up-down means are provided for controlling the direction of counting by said counter means in the automatic mode or in the manual mode, and said up-down means also operates to control the clock rate in both said modes.

10. The improved frequency scanning radio system of claim 9 wherein said improvement further includes read-out means for displaying the frequency being scanned, said read-out means connected to said counter means and operated by the count of the counter.

11. The improved frequency scanning radio system of claim 10 wherein said radio system comprises transceiver control means for selectively operating said radio system in the receiving mode or the transmitting mode, and wherein said improvement further includes means for shifting the frequency upward or downward in the transmit mode as a function of whether the radio is operating above the midpoint of the frequencies or below the midpoint of the frequencies provided by the said radio system.

* * * * *